(12) United States Patent
Li et al.

(10) Patent No.: US 11,404,489 B2
(45) Date of Patent: Aug. 2, 2022

(54) DISPLAY SUBSTRATE CAPABLE OF ALLEVIATING COLOR SEPARATION, AND DISPLAY DEVICE

(71) Applicant: BOE TECHNOLOGY GROUP CO., LTD., Beijing (CN)

(72) Inventors: Zhao Li, Beijing (CN); Hong Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/998,971

(22) Filed: Aug. 20, 2020

(65) Prior Publication Data
US 2021/0066405 A1    Mar. 4, 2021

(30) Foreign Application Priority Data

Aug. 28, 2019 (CN) .......................... 201910801882.4

(51) Int. Cl.
*H01L 29/08* (2006.01)
*H01L 27/32* (2006.01)
(Continued)

(52) U.S. Cl.
CPC ...... *H01L 27/3218* (2013.01); *H01L 51/5206* (2013.01); *H01L 51/5221* (2013.01); *H01L 51/56* (2013.01)

(58) Field of Classification Search
CPC ............. H01L 27/3218; H01L 51/5206; H01L 51/5221; H01L 51/56
(Continued)

(56) References Cited

U.S. PATENT DOCUMENTS

| 2011/0181825 A1* | 7/2011 | Ma ..................... G02F 1/13394 |
| | | 349/155 |
| 2015/0053955 A1 | 2/2015 | Furuie et al. |

(Continued)

FOREIGN PATENT DOCUMENTS

CN    104425555 A    3/2015

OTHER PUBLICATIONS

State Intellectual Property Office of the People's Republic of China, Office Action and Search Report Issued in Application No. 201910801882.4, dated Apr. 6, 2021, 18 pages. (Submitted with Partial Translation).

*Primary Examiner* — Phuc T Dang
(74) *Attorney, Agent, or Firm* — McCoy Russell LLP

(57) ABSTRACT

A display substrate, a manufacturing method thereof and a display device are provided. The display substrate includes: a driver circuit layer, a planarization layer and light-emitting units, each light-emitting unit includes an anode, a cathode and an organic light emitting layer located between the anode and the cathode, and the anode is connected to a driving electrode of the driver circuit layer through a via hole in the planarization layer. The organic light emitting layer includes: at least one pixel repetition unit, each pixel repetition unit includes multiple pixels, and each pixel includes multiple sub-pixels with different colors. Via holes in the planarization layer that correspond to same colored sub-pixels of at least two pixels in the same pixel repetition unit have different via hole positions, the via hole position being a relative position of a projection of a via hole in the planarization layer within corresponding sub-pixel.

8 Claims, 2 Drawing Sheets

(51) Int. Cl.
*H01L 51/52* (2006.01)
*H01L 51/56* (2006.01)

(58) Field of Classification Search
USPC .......................................................... 257/40
See application file for complete search history.

(56) References Cited

U.S. PATENT DOCUMENTS

2017/0179206 A1   6/2017  Lee et al.
2017/0287988 A1*  10/2017 Lee .................... H01L 27/3218
2018/0182827 A1*  6/2018  Kim .................... H01L 27/3258
2019/0131355 A1*  5/2019  Chae ................... H01L 27/3258

* cited by examiner

1

DISPLAY SUBSTRATE CAPABLE OF ALLEVIATING COLOR SEPARATION, AND DISPLAY DEVICE

CROSS-REFERENCE TO RELATED APPLICATION

The present application claims a priority to Chinese Patent Application No. 201910801882.4 filed in China on Aug. 28, 2019, the disclosure of which is incorporated herein in its entirety by reference.

TECHNICAL FIELD

The present disclosure relates to the field of display technology, and in particular to a display substrate, a manufacturing method thereof, and a display device.

BACKGROUND

In order to reduce an ambient light reflectivity of an organic light-emitting diode (OLED) display screen, a circular polarizer is attached to a light-emitting side of the OLED display screen in the related art. However, the circular polarizer will reduce a light-emitting efficiency of the OLED display screen. In order to ensure a brightness of the OLED display screen, a power consumption of the OLED display screen needs to be increased.

In order to reduce the power consumption of the OLED display screen, a color filter, instead of the circular polarizer, can be used. Compared with the circular polarizer, the color filter can improve the light-emitting efficiency of the OLED display screen and also improve the color gamut of the OLED display screen.

The OLED display screen includes a driver circuit layer, a planarization layer covering the driver circuit layer, and light-emitting units on the planarization layer, where each light-emitting unit includes an anode, a cathode and an organic light emitting layer located between the anode and the cathode. The anode is connected to a driving electrode in the driver circuit layer through a via hole in the planarization layer. Due to the existence of via holes in the planarization layer, the surface of the planarization layer cannot be completely flat, thereby the surface of the anodes cannot be completely flat.

Thus, when the ambient light impinges on and is reflected by the anodes of the OLED display screen in a black screen state, since via holes in the planarization layer that correspond to same colored sub-pixels of at least two pixels in a same pixel repetition unit have identical via hole positions, the via hole position being a relative position of a projection of a via hole in the planarization layer within corresponding sub-pixel, the same colored sub-pixels of the organic light emitting layer reflect light in the same direction. After passing through the color filter, the reflection directions of reflected light with the same color are the same, and the reflection directions of reflected light with different colors are different, resulting in significant color separation.

SUMMARY

To solve the above technical problems, the following technical solutions are provided in the embodiments of the present disclosure.

In one aspect, a display substrate is provided. The display substrate includes a driver circuit layer on a base substrate; a planarization layer covering the driver circuit layer; light-emitting units located on the planarization layer, wherein each of the light-emitting units includes an anode, a cathode and an organic light emitting layer located between the anode and the cathode, and the anode is connected to a driving electrode of the driver circuit layer through a via hole in the planarization layer; wherein the organic light emitting layer includes at least one pixel repetition unit, each pixel repetition unit includes multiple pixels, and each pixel includes multiple sub-pixels with different colors; wherein via holes in the planarization layer that correspond to same colored sub-pixels of at least two pixels in the same pixel repetition unit have different via hole positions, the via hole position being a relative position of a projection of a via hole in the planarization layer within corresponding sub-pixel.

Optionally, via holes in the planarization layer that correspond to same colored sub-pixels of different pixels in the same pixel repetition unit have different via hole positions.

Optionally, each of the at least one pixel repetition unit includes k pixels, and the via hole positions of the via holes in the planarization layer satisfies a condition that an angle between a $(i+1)^{th}$ imaginary line and a $i^{th}$ imaginary line is $360°/k$, the $(i+1)^{th}$ imaginary line is an imaginary line between a via hole position of a via hole in the planarization layer that corresponds to a sub-pixel with a preset color of a $(i+1)^{th}$ pixel and a center point of the sub-pixel with the preset color of the $(i+1)^{th}$ pixel, the $i^{th}$ imaginary line is an imaginary line between a via hole position of a via hole in the planarization layer that corresponds to a sub-pixel with the preset color of a $i^{th}$ pixel and a center point of the sub-pixel with the preset color of the $i^{th}$ pixel, k is an integer greater than 1, and i is an integer greater than 0 and less than k.

Optionally, via hole positions of via holes in the planarization layer that correspond to same colored sub-pixels of at least two pixels in the same pixel repetition unit have a same distance to center points of respective sub-pixels.

Optionally, via hole positions of via holes in the planarization layer that correspond to same colored sub-pixels of various pixels in the same pixel repetition unit have a same distance to center points of respective sub-pixels.

Optionally, $k=N*N$, and N is an integer greater than 2.

A display device is also provided according to some embodiments of the present disclosure. The display device includes the foregoing display substrate.

A method of manufacturing a display substrate is also provided according to some embodiments of the present disclosure. The method includes:

forming a driver circuit layer on a base substrate, a planarization layer covering the driver circuit layer and light-emitting units on the planarization layer, wherein each light-emitting unit includes an anode, a cathode and an organic light emitting layer located between the anode and the cathode, and the anode is connected to a driving electrode of the driver circuit layer through a via hole in the planarization layer; the organic light emitting layer includes at least one pixel repetition unit, each pixel repetition unit includes multiple pixels, and each pixel includes multiple sub-pixels with different colors;

etching the planarization layer to form via holes, wherein the via holes in the planarization layer that correspond to same colored sub-pixels of at least two pixels in the same pixel repetition unit have different via hole positions, the via hole position being a relative position of a projection of a via hole in the planarization layer within corresponding sub-pixel.

Optionally, via holes in the planarization layer that correspond to same colored sub-pixels of different pixels in the same pixel repetition unit have different via hole positions.

Optionally, each of the at least one pixel repetition unit includes k pixels, and the via hole positions of the via holes in the planarization layer satisfies a condition that an angle between a $(i+1)^{th}$ imaginary line and a $i^{th}$ imaginary line is $360°/k$, the $(i+1)^{th}$ imaginary line is an imaginary line between a via hole position of a via hole in the planarization layer that corresponds to a sub-pixel with a preset color of a $(i+1)^{th}$ pixel and a center point of the sub-pixel with the preset color of the $(i+1)^{th}$ pixel, the $i^{th}$ imaginary line is an imaginary line between a via hole position of a via hole in the planarization layer that corresponds to a sub-pixel with the preset color of a $i^{th}$ pixel and a center point of the sub-pixel with the preset color of the $i^{th}$ pixel, k is an integer greater than 1, and i is an integer greater than 0 and less than k.

Figure 1:
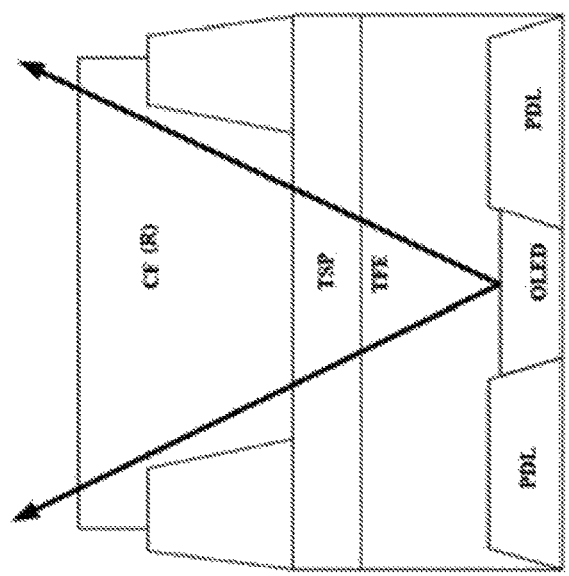
FIG. 1 is a schematic diagram of a display substrate according to an embodiment of the present disclosure.
Figure 1:
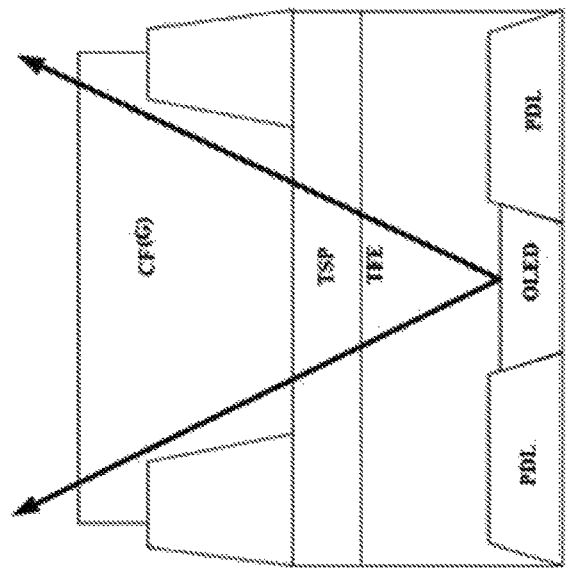
Figure 1:
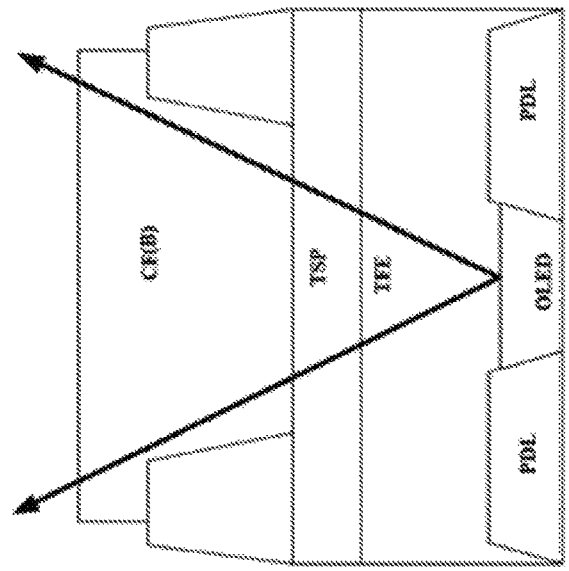

REFERENCE NUMERALS 1 pixel
11 first sub-pixel
12 second sub-pixel
13 third sub-pixel
2 via hole position of via hole in the planarization layer
3 center point.

DETAILED DESCRIPTION

To describe the objective, the technical solutions and the advantages of embodiments of the present disclosure more clearly, a detailed description in conjunction with drawings and specific embodiments of the present disclosure is given below.

In order to reduce power consumption of OLED display screen, a color filter is attached to a light-emitting side of the OLED display screen in the related art. The OLED display screen includes a driver circuit layer, a planarization layer covering the driver circuit layer, and light-emitting units located on the planarization layer, where each light-emitting unit includes an anode, a cathode and an organic light emitting layer located between the anode and the cathode. The anode is connected to a driving electrode in the driver circuit layer through a via hole in the planarization layer. Due to the existence of via holes in the planarization layer, the surface of the planarization layer cannot be completely flat, thereby the surface of the anodes cannot be completely flat.

Thus, when the ambient light impinges on and is reflected by the anodes of the OLED display screen in a black screen state, since via holes in the planarization layer that correspond to same colored sub-pixels of at least two pixels in a same pixel repetition unit have identical via hole positions, the same colored sub-pixels of the organic light emitting layer reflect light in the same direction. After passing through the color filter, the reflection directions of reflected light with the same color are the same, and the reflection directions of reflected light with different colors are different, resulting in significant color separation.

The via hole position is a relative position of a projection of a via hole in the planarization layer within corresponding sub-pixel.

It is noted, the organic light emitting layer includes differently colored sub-pixels, and the color filter also includes differently colored sub-pixels. Having been reflected on the sub-pixels of the organic light emitting layer, ambient light will continue to go through the color filter.

In order to solve the above problems, a display substrate, a manufacturing method thereof and a display device are provided according to some embodiments of the present disclosure, which can alleviate the color separation.

In view of the identical via hole positions of via holes in the planarization layer that correspond to same colored sub-pixels of different pixels in a same pixel repetition unit in the related art, positions of the via holes in the planarization layer are changed in the present disclosure, so that the via holes in the planarization layer that correspond to same colored sub-pixels of different pixels in the same pixel repetition unit have different via hole positions, thereby dispersing reflected light with the same color into different directions.

A display substrate is provided according to an embodiment of the present disclosure. The display substrate includes a driver circuit layer located on a base substrate; a planarization layer covering the driver circuit layer; and light-emitting units located on the planarization layer, where each light-emitting unit includes an anode, a cathode and an organic light emitting layer located between the anode and the cathode, and the anode is connected to a driving electrode of the driver circuit layer through a via hole in the planarization layer; the organic light emitting layer includes at least one pixel repetition unit, each pixel repetition unit includes multiple pixels, and each pixel includes multiple sub-pixels with different colors; via holes in the planarization layer that correspond to same colored sub-pixels of at least two pixels in the same pixel repetition unit have different via hole positions, the via hole position being a relative position of a projection of a via hole in the planarization layer within corresponding sub-pixel.

In the embodiment, via holes in the planarization layer that correspond to same colored sub-pixels of different pixels in the same pixel repetition unit have different via hole positions. In this way, when the ambient light impinges on and is reflected by the anodes of the OLED display screen in a black screen state, the same colored sub-pixels of at least two pixels of the organic light emitting layer reflect light in different directions. After passing through the color filter, the reflection directions of reflected light with the same color are different, thereby alleviating color separation.

FIG. 1 is a schematic diagram of a display substrate according to an embodiment of the present disclosure. As shown in FIG. 1, OLEDs are formed on anodes, and further a pixel defining layer (PDL), a thin film encapsulation (TFE), a touch screen panel (TSP) and a color filter (CF) are formed on the anodes. As shown in the drawing, three differently colored sub-pixels of a pixel in the color filter include a blue sub-pixel, a green sub-pixel and a red sub-pixel.

In the related art, via holes in the planarization layer that correspond to same colored sub-pixels of different pixels in a same pixel repetition unit have identical via hole positions. In contrast, in the embodiment, via holes in the planarization layer that correspond to same colored sub-pixels of different pixels in a same pixel repetition unit have different via hole positions. When at least two pixels include a first pixel and a second pixel, via holes in the planarization layer that correspond to same colored sub-pixels of the first and second pixels have different via hole positions. For example, a via hole position of a via hole in the planarization layer that corresponds to a red sub-pixel of the first pixel is different from a via hole position of a via hole in the planarization layer that corresponds to a red sub-pixel of the second pixel; a via hole position of a via hole in the planarization layer that corresponds to a green sub-pixel of the first pixel is different from a via hole position of a via hole in the planarization layer that corresponds to a green sub-pixel of the second pixel; and a via hole position of a via hole in the planarization layer that corresponds to a blue sub-pixel of the first pixel is different from a via hole position of a via hole in the planarization layer that corresponds to a blue sub-pixel of the second pixel.

Optionally, via holes in the planarization layer that correspond to same colored sub-pixels of different pixels in the same pixel repetition unit have different via hole positions, the via hole position being a relative position of a projection of a via hole in the planarization layer within corresponding sub-pixel. In this way, when the ambient light impinges on and is reflected by the anodes of the OLED display screen in a black screen state, the same colored sub-pixels of different pixels in a same pixel repetition unit reflect light in different directions. After passing through the color filter, the reflection directions of reflected light with the same color are different, thereby alleviating color separation.

Via holes in the planarization layer can be arranged according to a certain rule or can be arranged randomly, as long as via holes in the planarization layer that correspond to same colored sub-pixels of at least two pixels in the same pixel repetition unit have different via hole positions.

In a specific embodiment, the pixel repetition unit includes k pixels, and the via hole positions of the via holes in the planarization layer satisfies a condition that an angle between a $(i+1)^{th}$ imaginary line and a $i^{th}$ imaginary line is $360°/k$, the $(i+1)^{th}$ imaginary line is an imaginary line between a via hole position of a via hole in the planarization layer that corresponds to a sub-pixel with a preset color of a $(i+1)^{th}$ pixel and a center point of the sub-pixel with the preset color of the $(i+1)^{th}$ pixel, the $i^{th}$ imaginary line is an imaginary line between a via hole position of a via hole in the planarization layer that corresponds to a sub-pixel with the preset color of a $i^{th}$ pixel and a center point of the sub-pixel with the preset color of the $i^{th}$ pixel, where k is an integer greater than 1, and i is an integer greater than 0 and less than k. In this way, via holes in the planarization layer that correspond to same colored sub-pixels of different pixels in the same pixel repetition unit can be arranged according to a certain rule and have different via hole positions.

In a specific embodiment, via hole positions of via holes in the planarization layer that correspond to same colored sub-pixels of at least two pixels in the same pixel repetition unit may have a same distance to center points of respective sub-pixels.

Optionally, via hole positions of via holes in the planarization layer that correspond to same colored sub-pixels of various pixels in the same pixel repetition unit have a same distance to center points of respective sub-pixels. In this way, via holes in the planarization layer that correspond to same colored sub-pixels of different pixels in a pixel repetition unit may have regularly arranged via hole positions, such that reflected light of sub-pixels with the same color are reflected uniformly to multiple directions, thereby alleviating color separation.

Specifically, a value of k can be N*N, where N is an integer greater than 2, so that each pixel repetition unit includes multiple pixels arranged in an array. Because directions of the light reflected by sub-pixels with a same color of pixels in a pixel repetition unit are different, directions of the light reflected by sub-pixels with a same color of multiple pixels arranged in an array can be different, thereby alleviating color separation significantly. Of course, the value of k is not limited to N*N, and can also be other values.

A display substrate of the present disclosure will be further introduced below in conjunction with drawings and specific embodiments.

Figure 2:
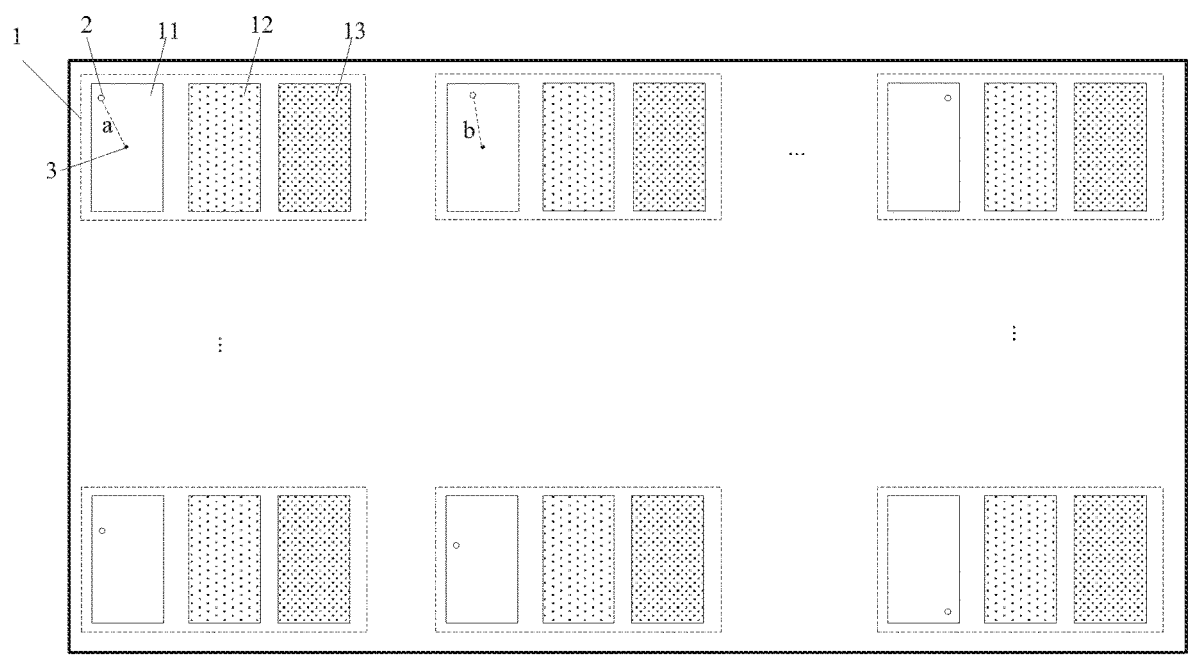
FIG. 2 is a schematic diagram of a pixel repetition unit according to an embodiment of the present disclosure.

The display substrate of the embodiment includes a plurality of pixel repetition units. As shown in FIG. 2, each pixel repetition unit includes N*N pixels 1, each pixel 1 includes three differently colored sub-pixels: a first sub-pixel 11, a second sub-pixel 12 and a third sub-pixel 13, and a via hole in the planarization layer that corresponds to each sub-pixel has a via hole position 2. Taking the first sub-pixel 11 as an example, an imaginary line between the via hole position 2 of the via hole in the planarization layer that corresponds to the first sub-pixel 11 of the first pixel in the pixel repetition unit and the center point 3 of the sub-pixel 11 of the first pixel is a; an imaginary line between the via hole position 2 of the via hole in the planarization layer that corresponds to the first sub-pixel 11 of the second pixel in the pixel repetition unit and the center point 3 of the sub-pixel 11 of the second pixel is b; where an angle between a and b is $360°/(N*N)$. That is, the imaginary line between the via hole position 2 of the via hole in the planarization layer that corresponds to the first sub-pixel 11 of a pixel and the center point 3 of the sub-pixel 11 of the pixel rotates by $360°/(N*N)$ in a clockwise direction with respect to the imaginary line between the via hole position 2 of the via hole in the planarization layer that corresponds to the first sub-pixel 11 of a previous pixel and the center point 3 of the sub-pixel 11 of the previous pixel. In this way, the via holes in the planarization layer that correspond to the first sub-pixels 11 of different pixels in the pixel repetition unit may have different via hole positions 2. When the ambient light impinges on and is reflected by the anodes of the OLED display screen in a black screen state, the first sub-pixels 11 of different pixels in a same pixel repetition unit reflect light in different directions. That is, the reflection directions of reflected light with the same color are different, thereby alleviating color separation.

Specifically, the value of N can be 4 or 5. Of course, the value of N is not limited to 4 and 5, and other values can also be used. When the value of N is 4, the imaginary line between the via hole position 2 of the via hole in the planarization layer that corresponds to the first sub-pixel 11 of a pixel and the center point 3 of the sub-pixel 11 of the pixel rotates by 22.5° in a clockwise direction with respect to the imaginary line between the via hole position 2 of the via hole in the planarization layer that corresponds to the first sub-pixel 11 of a previous pixel and the center point 3 of the sub-pixel 11 of the previous pixel. When the value of N is 5, the imaginary line between the via hole position 2 of the via hole in the planarization layer that corresponds to the first sub-pixel 11 of a pixel and the center point 3 of the sub-pixel 11 of the pixel rotates by 14.4° in a clockwise direction with respect to the imaginary line between the via hole position 2 of the via hole in the planarization layer that corresponds to the first sub-pixel 11 of a previous pixel and the center point 3 of the sub-pixel 11 of the previous pixel.

For the second sub-pixels 12 and the third sub-pixels 13, reference may be made to the configuration of the first sub-pixels 11 described above, and a repeated description is omitted.

A display device is provided according to an embodiment of the present disclosure. The display device includes the display substrate as described above. The display device includes, but is not limited to: a radio frequency unit, network module, audio output unit, input unit, sensor, display unit, user input unit, interface unit, memory, processor, power supply and the like. Those skilled in the art may understand that the above-mentioned display device structure does not constitute a limitation on the display device, and the display device may include more or less of the above-mentioned components, or combine certain components, or have different component layout. In the embodiments of the present disclosure, the display device includes, but is not limited to: a display, a mobile phone, a tablet computer, a television, a wearable electronic device, a navigation display device, and the like.

The display device may be any product or component with a display function, such as a TV, a display, a digital photo frame, a mobile phone, a tablet computer. The display device further includes a flexible printed circuit, a printed circuit board, and a backplane.

A method of manufacturing a display substrate is also provided according to an embodiment of the present disclosure. The method includes forming a driver circuit layer on a base substrate, a planarization layer covering the driver circuit layer and light-emitting units on the planarization layer, wherein each light-emitting unit includes an anode, a cathode and an organic light emitting layer located between the anode and the cathode, and the anode is connected to a driving electrode of the driver circuit layer through a via hole in the planarization layer; the organic light emitting layer includes at least one pixel repetition unit, each pixel repetition unit includes multiple pixels, and each pixel includes multiple sub-pixels with different colors;

etching the planarization layer to form via holes, wherein the via holes in the planarization layer that correspond to same colored sub-pixels of at least two pixels in the same pixel repetition unit have different via hole positions, the via hole position being a relative position of a projection of a via hole in the planarization layer within corresponding sub-pixel.

In the embodiment, via holes in the planarization layer that correspond to same colored sub-pixels of different pixels in the same pixel repetition unit have different via hole positions. In this way, when the ambient light impinges on and is reflected by the anodes of the OLED display screen in a black screen state, the same colored sub-pixels of at least two pixels of the organic light emitting layer reflect light in different directions. After passing through the color filter, the reflection directions of reflected light with the same color are different, thereby alleviating color separation.

In the related art, via holes in the planarization layer that correspond to same colored sub-pixels of different pixels in a same pixel repetition unit have identical via hole positions. In contrast, in the embodiment, via holes in the planarization layer that correspond to same colored sub-pixels of different pixels in a same pixel repetition unit have different via hole positions. When at least two pixels include a first pixel and a second pixel, via holes in the planarization layer that correspond to same colored sub-pixels of the first and second pixels have different via hole positions. For example, a via hole position of a via hole in the planarization layer that corresponds to a red sub-pixel of the first pixel is different from a via hole position of a via hole in the planarization layer that corresponds to a red sub-pixel of the second pixel; a via hole position of a via hole in the planarization layer that corresponds to a green sub-pixel of the first pixel is different from a via hole position of a via hole in the planarization layer that corresponds to a green sub-pixel of the second pixel; and a via hole position of a via hole in the planarization layer that corresponds to a blue sub-pixel of the first pixel is different from a via hole position of a via hole in the planarization layer that corresponds to a blue sub-pixel of the second pixel.

Optionally, via holes in the planarization layer that correspond to same colored sub-pixels of different pixels in the same pixel repetition unit have different via hole positions. In this way, when the ambient light impinges on and is reflected by the anodes of the OLED display screen in a black screen state, the same colored sub-pixels of different pixels in a same pixel repetition unit reflect light in different directions. After passing through the color filter, the reflection directions of reflected light with the same color are different, thereby alleviating color separation significantly.

Via holes in the planarization layer can be arranged according to a certain rule or can be arranged randomly, as long as via holes in the planarization layer that correspond to same colored sub-pixels of different pixels in the same pixel repetition unit have different via hole positions.

In a specific embodiment, the pixel repetition unit includes k pixels, and the via hole positions of the via holes in the planarization layer satisfies a condition that an angle between a $(i+1)^{th}$ imaginary line and a $i^{th}$ imaginary line is $360°/k$, the $(i+1)^{th}$ imaginary line is an imaginary line between a via hole position of a via hole in the planarization layer that corresponds to a sub-pixel with a preset color of a $(i+1)^{th}$ pixel and a center point of the sub-pixel with the preset color of the $(i+1)^{th}$ pixel, the $i^{th}$ imaginary line is an imaginary line between a via hole position of a via hole in the planarization layer that corresponds to a sub-pixel with the preset color of a $i^{th}$ pixel and a center point of the sub-pixel with the preset color of the $i^{th}$ pixel, where k is an integer greater than 1, and i is an integer greater than 0 and less than k. In this way, via holes in the planarization layer that correspond to same colored sub-pixels of different pixels in the same pixel repetition unit can be arranged according to a certain rule and have different via hole positions.

In a specific embodiment, via hole positions of via holes in the planarization layer that correspond to same colored sub-pixels of at least two pixels in the same pixel repetition unit may have a same distance to center points of respective sub-pixels.

Optionally, via hole positions of via holes in the planarization layer that correspond to same colored sub-pixels of different pixels in the same pixel repetition unit have a same distance to center points of respective sub-pixels. In this way, via holes in the planarization layer that correspond to same colored sub-pixels of different pixels in a pixel repetition unit may have regularly arranged via hole positions, such that reflected light of sub-pixels with the same color are reflected uniformly to multiple directions, thereby alleviating color separation.

Specifically, a value of k can be N*N, where N is an integer greater than 2, so that each pixel repetition unit includes multiple pixels arranged in an array. Because directions of the light reflected by sub-pixels with a same color of pixels in a pixel repetition unit are different, directions of the light reflected by sub-pixels with a same color of multiple pixels arranged in an array can be different, thereby alleviating color separation significantly. Of course, the value of k is not limited to N*N, and can also be other values.

It should be noted that the embodiments in this specification are described in a progressive manner, and the same or similar parts between the embodiments can be referred to each other. Each embodiment focuses on the differences from other embodiments. In particular, for the method embodiments, since they are basically similar to the product embodiments, the description thereof is relatively simple, and for the relevant parts, references can be made to the description of the product embodiments.

Unless otherwise defined, the technical or scientific terms used in the present disclosure shall have the ordinary meanings understood by those of ordinary skill in the art to which the present disclosure belongs. The terms "first", "second", and the like used in this disclosure do not indicate any order, quantity, or priority, but are only used to distinguish different components. The terms "include", "have" or any variations thereof are intended to mean that an element or article followed by such a term encompasses a list of elements or articles preceded by such a term, or equivalents thereof, without precluding other elements or articles. Expressions such as "connection" or "connected" are not limited to physical or mechanical connections, but may include electrical connections, whether direct or indirect. Terms "Up", "down", "left", "right", etc. are only used to indicate the relative position relationship. When the absolute position of the described object changes, the relative position relationship may change accordingly.

It will be understood that when an element, such as a layer, film, area or substrate, is referred to as being "on" or "under" another element, it can be directly on or directly under the other element, or intervening elements may also be present.

The specific features, structures, materials or characteristics in the description of forgoing implementations may be combined in any one or more embodiments or examples in proper manners.

The above descriptions merely describe specific implementations of the present disclosure, and the scope of the present disclosure is not limited thereto. Any modifications or substitutions easily occurring to a person of ordinary skill in the art without departing from the principle of the present disclosure shall fall within the scope of the present disclosure. Therefore, the scope of the present disclosure is defined by the scope of the claims.

The invention claimed is:

1. A display substrate, comprising:
   a driver circuit layer on a base substrate;
   a planarization layer covering the driver circuit layer;
   light-emitting units located on the planarization layer, wherein each of the light-emitting units comprises an anode, a cathode and an organic light emitting layer located between the anode and the cathode, and the anode is connected to a driving electrode of the driver circuit layer through a via hole in the planarization layer;
   wherein the organic light emitting layer comprises at least one pixel repetition unit, each pixel repetition unit comprises multiple pixels, and each pixel comprises multiple sub-pixels with different colors;
   wherein the via holes in the planarization layer that correspond to same colored sub-pixels of at least two pixels in the same pixel repetition unit have different via hole positions, the via hole position being a relative position of a projection of the via hole in the planarization layer within corresponding sub-pixel;
   wherein each of the at least one pixel repetition unit comprises k pixels, and the via hole positions of the via holes in the planarization layer satisfies a condition that an angle between a $(i+1)^{th}$ imaginary line and a $i^{th}$ imaginary line is 360°/k, the $(i+1)^{th}$ imaginary line is an imaginary line between the via hole position of the via hole in the planarization layer that corresponds to a sub-pixel with a preset color of a $(i+1)^{th}$ pixel and a center point of the sub-pixel with the preset color of the $(i+1)^{th}$ pixel, the $i^{th}$ imaginary line is an imaginary line between the via hole position of the via hole in the planarization layer that corresponds to a sub-pixel with the preset color of a $i^{th}$ pixel and a center point of the sub-pixel with the preset color of the $i^{th}$ pixel, k is an integer greater than 1, and i is an integer greater than 0 and less than k.

2. The display substrate according to claim 1, wherein via holes in the planarization layer that correspond to same colored sub-pixels of different pixels in the same pixel repetition unit have different via hole positions.

3. The display substrate according to claim 1, wherein via hole positions of via holes in the planarization layer that correspond to same colored sub-pixels of at least two pixels in the same pixel repetition unit have a same distance to center points of respective sub-pixels.

4. The display substrate according to claim 3, wherein via hole positions of via holes in the planarization layer that correspond to same colored sub-pixels of different pixels in the same pixel repetition unit have a same distance to center points of respective sub-pixels.

5. The display substrate according to claim 1, wherein k=N*N, and N is an integer greater than 2.

6. A display device, comprising the display substrate according to claim 1.

7. A method of manufacturing a display substrate, comprising:
   forming a driver circuit layer on a base substrate, a planarization layer covering the driver circuit layer and light-emitting units on the planarization layer, wherein each light-emitting unit comprises an anode, a cathode and an organic light emitting layer located between the anode and the cathode, and the anode is connected to a driving electrode of the driver circuit layer through a via hole in the planarization layer; the organic light emitting layer comprises at least one pixel repetition unit, each pixel repetition unit comprises multiple pixels, and each pixel comprises multiple sub-pixels with different colors;
   etching the planarization layer to form the via holes, wherein the via holes in the planarization layer that correspond to same colored sub-pixels of at least two pixels in the same pixel repetition unit have different via hole positions, the via hole position being a relative position of a projection of the via hole in the planarization layer within corresponding sub-pixel;
   wherein each of the at least one pixel repetition unit comprises k pixels, and the via hole positions of the via holes in the planarization layer satisfies a condition that an angle between a $(i+1)^{th}$ imaginary line and a $i^{th}$ imaginary line is 360°/k, the $(i+1)^{th}$ imaginary line is an imaginary line between the via hole position of the via hole in the planarization layer that corresponds to a sub-pixel with a preset color of a $(i+1)^{th}$ pixel and a center point of the sub-pixel with the preset color of the $(i+1)$th pixel, the $i^{th}$ imaginary line is an imaginary line between the via hole position of the via hole in the planarization layer that corresponds to a sub-pixel with the preset color of a $i^{th}$ pixel and a center point of the sub-pixel with the preset color of the $i^{th}$ pixel, k is an integer greater than 1, and i is an integer greater than 0 and less than k.

8. The method according to claim 7, wherein via holes in the planarization layer that correspond to same colored sub-pixels of different pixels in the same pixel repetition unit have different via hole positions.

* * * * *